(12) United States Patent
Diaz et al.

(10) Patent No.: US 6,337,125 B1
(45) Date of Patent: Jan. 8, 2002

(54) HIGH-PERFORMANCE MATCHED ABSORBER USING MAGNETODIELECTRICS

(75) Inventors: Rodolfo E. Diaz, Phoenix; Michael C. Miller, Chandler; Michael M. Lo Re', Phoenix; James P. K. Gilb, Tempe, all of AZ (US); Shahriar Alam, Chandler, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 39 days.

(21) Appl. No.: 09/616,853

(22) Filed: Jul. 14, 2000

Related U.S. Application Data

(62) Division of application No. 08/368,782, filed on Jan. 4, 1995, now Pat. No. 6,146,691.

(51) Int. Cl.[7] .................................................. B32B 7/02
(52) U.S. Cl. ........................ 428/218; 428/323; 428/328; 428/699
(58) Field of Search ................................ 428/212, 323, 428/328, 218, 329, 699, 701

(56) References Cited

U.S. PATENT DOCUMENTS

| | | | | |
|---|---|---|---|---|
| 4,012,738 A | * | 3/1977 | Wright ..................... 343/18 A |
| 4,414,339 A | * | 11/1983 | Solc et al. .................. 523/137 |
| 4,690,778 A | * | 9/1987 | Narumiya et al. .......... 252/506 |
| 4,862,174 A | * | 8/1989 | Naito et al. ..................... 342/1 |
| 5,258,596 A | * | 11/1993 | Fabish et al. ............ 219/10.55 |
| 5,872,534 A | * | 2/1999 | Mayer ........................... 342/1 |
| 5,990,417 A | * | 11/1999 | Senda et al. .................. 174/35 |
| 6,117,517 A | * | 9/2000 | Diaz et al. ................... 428/102 |
| 6,146,691 A | * | 11/2000 | Diaz et al. ................... 427/131 |

* cited by examiner

*Primary Examiner*—Hoa T. Le
(74) *Attorney, Agent, or Firm*—Terry J. Anderson; Karl J. Hoch, Jr.

(57) ABSTRACT

A composite electromagnetic absorber provides increased EMR absorption while being thinner and/or lighter than prior art EMR absorbers. To accomplish this, synthetic dielectric materials are combined with either synthetic magnetic materials or magnetically lossy materials in such a way that the permittivity and permeability of the composite material are substantially matched over the desired range of frequency. The match in the permittivity and permeability allows the majority of the electromagnetic fields to enter the material where the electric and magnetic loss components absorb the electromagnetic energy.

4 Claims, 13 Drawing Sheets

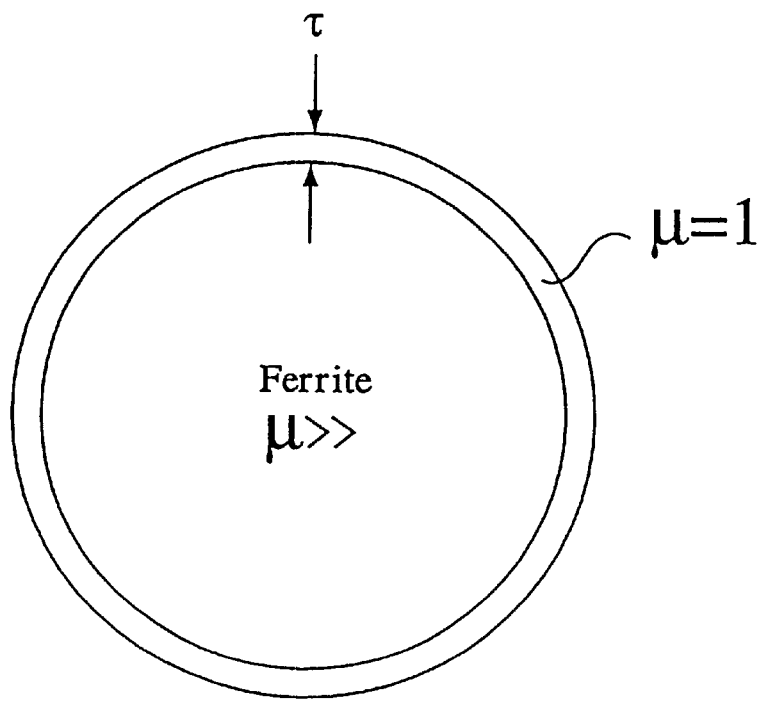
Fig. 15
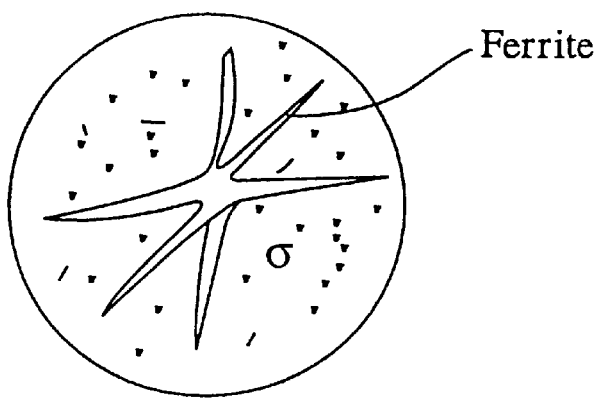 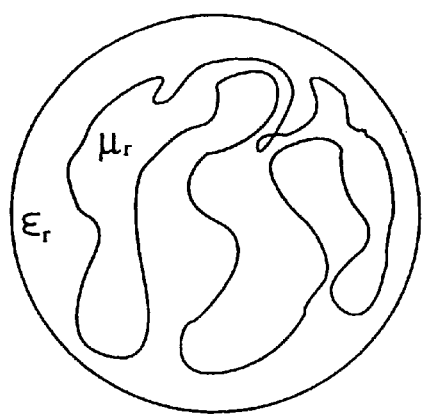
Fig. 16  Fig. 17

A plot of $X^m(w)$ against $\log(f(Hz))$ for water-based ferrofluid (curve A) and a plot of $X^m(w)$ against $\log(f(Hz))$ for 10 Neel components (curve B).

ABSORBER USING
MAGNETODIELECTRICS

CROSS-REFERENCE TO RELATED APPLICATIONS

This patent application is a divisional of U.S. patent application Ser. No. 08/368,782 filed Jan. 4, 1995, now issued as U.S. Pat. No. 6,146,691 on Nov. 14, 2000.

BACKGROUND OF THE PRESENT INVENTION

The present invention relates to composite electromagnetic absorbing materials. Electromagnetic absorbing material are used in a variety of applications. They are used in Electromagnetic Compatibility/Electromagnetic Interference (EMC/EMI) test cells to eliminate reflection and interference in the testing. Absorbers are also used in Electromagnetic anechoic chambers for testing high frequency radar, antennas and in Low Observable (LO) structures. The increase in consumer electronics that broadcast, such as cellular telephones and portable computers, have created a new need: the suppression of stray electromagnetic signals in airplanes and near airports to prevent interference with airport radar, communications and automated landing systems. Intelligent Vehicle Highway Systems (IHVS) may also require suppression of electromagnetic signals to prevent multi-path and other types of interference.

Previously, electromagnetic absorbers used only either the electric or the magnetic properties of a material to attenuate the electromagnetic fields. Electric absorption is normally achieved by introducing lossy material, often carbon, to a low dielectric constant material. Examples of this approach include carbon loaded foam and carbon loaded honeycomb. An alternate method is to use specific foam and carbon loaded honeycomb. An alternate method is to use specific patterns of the lossy material to achieve a Debye relaxation of the dielectric constant. See U.S. Patent application Ser. No. 07/890,757 titled "Method for Making a Material with Artificial Dielectric Constant" now U.S. Pat. No. 5,385,623 the disclosure of which is incorporated by reference. The relaxation of the dielectric constant produces a loss in the material that can be accurately controlled in both magnitude and frequency.

Magnetic loss is generally achieved by using a material that exhibits a natural magnetic loss mechanism. Ferrites are a class of material that exhibit this type of loss and are often used in absorbing materials. However, in the frequency range where the ferrites loss is useful, the real part of their relative permittivity and real part of their relative permeability are very different from each other. The result is that the material's impedance is not close to the impedance of free space and a significant part of the incident energy reflects off the surface. Only when the interference between the surface reflection and reflection from the surface underneath the ferrite cancel each other does the material exhibit its full loss. Therefore, absorbers which use ferrites are effective only over a limited band of frequencies.

The performance of electromagnetic absorbing materials can be improved through grading the electric and magnetic properties within the material and/or by shaping the material. However, even with these techniques, the current state of the art of electromagnetic absorbers results in materials that are either very thick, or work only over a narrow band of frequency. For example, carbon-loaded, foam pyramids used in EMC/EMI test cells are approximately 10 feet long and require ferrite tiles on their base to achieve 10 dB of absorption from 10 MHz to 1 GHz. The size and weight of the pyramids places special requirements on room size and the load bearing capacity of the walls and ceiling.

Thus none of the previous solutions for electromagnetic absorbing materials is totally satisfactory and a need still exists to enhance the performance of electromagnetic absorbers. It is toward the fulfillment of this need that the present invention is directed.

BRIEF SUMMARY OF THE INVENTION

The present invention provides a means and methods to create composite electromagnetic absorbers that provide increased absorption and are thinner and/or lighter than the prior art. To accomplish this, synthetic dielectric materials are combined with either synthetic magnetic materials or magnetically lossy materials in such a way that the permittivity and permeability of the composite material are substantially matched over the desired range of frequency. The match in the permittivity and permeability allows the majority of the electromagnetic fields to enter the material where the electric and magnetic loss components absorb the electromagnetic energy.

BRIEF DESCRIPTION OF THE DRAWINGS

FIG. 15 shows a sphere with a constant permeability, ferrite center and a shell of non-magnetic metal;

FIG. 16 shows a sphere made of 'jack'-shaped ferrite encased in a conductive material;

FIG. 17 shows a sphere similar to that of FIG. 16 but with the electric relaxation (polarizability) designed to coincide with the naturally occuring magnetic counterpart.

DESCRIPTION OF THE PREFERRED EMBODIMENTS

Figure 1:
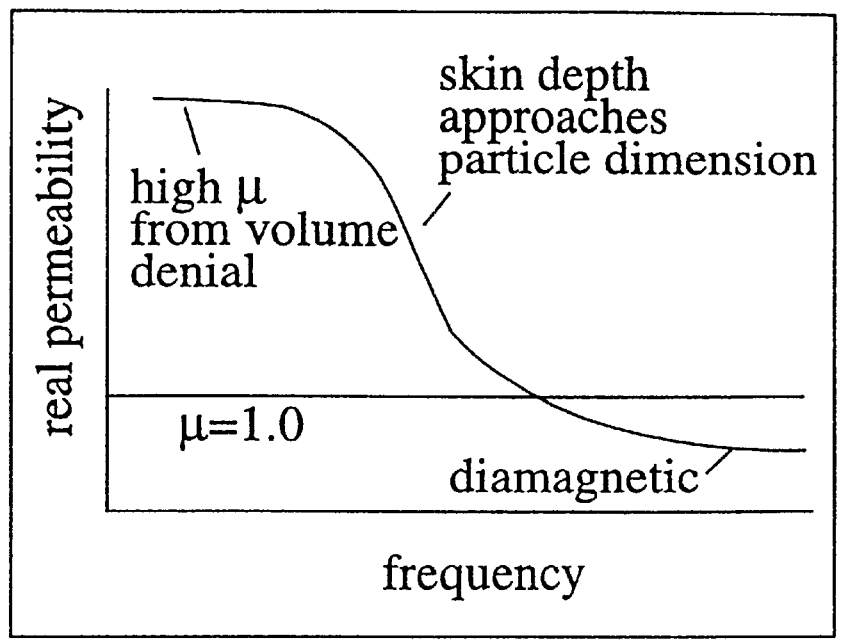
FIG. 1 plots the real permeability versus frequency for a single conducting, permeable particle.

Absorbing an electromagnetic wave incident from free space onto the material involves two important steps;

1. Getting the majority of the power of wave to enter the material.

2. Dissipating the power of the wave as heat using the loss mechanisms in the material.

The first condition is controlled by the thickness of the material, the frequency of the incident wave and the intrinsic impedance of the material. The intrinsic impedance of the material is given by $$Z_m = \sqrt{\frac{\mu}{\epsilon}} = \sqrt{\frac{\mu_0}{\epsilon_0}}\sqrt{\frac{\mu_r}{\epsilon_r}} = \eta\sqrt{\frac{\mu_r}{\epsilon_r}} \qquad (1)$$

where $\mu$ is the permeability of the material. $\mu_0$ is the permeability of free space. $\mu_r = \mu/\mu_0$ is the relative permeability, $\epsilon$ is the permittivity of the material. $\epsilon_0$ is the permittivity of free space, $\epsilon_r = \epsilon/\epsilon_0$ is the relative permittivity of the material and $\eta = \sqrt{\mu_0/\epsilon_0} = 377\Omega$ is the impedance of free space. Note that the permittivity and permeability of materials are generally complex and frequency dependent, i.e.

$$\mu = \mu'(f) - j\mu''(f) \qquad (2)$$

$$\epsilon = \epsilon'(f) - j\epsilon''(f) \qquad (3)$$

where $j = \sqrt{\sqrt{-1}}$ is the imaginary unit. When the impedance of the material is the same as free space, all of the power in the incident wave enters the material regardless of the thickness or operating frequency. Clearly, the impedance of the material will be equal to free space when $\mu_r = \epsilon_r$.

The second condition is controlled by the loss that the electromagnetic wave experiences once it has entered the material. The power dissipated, $P_L$, is roughly proportional to an exponential function $$P_L \, e^{-2\gamma l} \qquad (4)$$

where l is the thickness of the material and $\gamma$ is the complex propagation constant given by $$\gamma = j2\pi f\sqrt{\mu\epsilon} \qquad (5)$$

and $f$ is the operating frequency of the wave. The loss, which is the real part of $\gamma$, comes from the imaginary parts of the permittivity and/or permeability, $\mu''$ and $\epsilon''$. So to attenuate the wave, the material should have large imaginary parts of the permittivity and/or permeability.

Thus the ideal absorbing material is one which has an impedance equal to free space and is as lossy as possible. This gives the conditions $$\mu_r(f) = \epsilon_r(f) \qquad (6)$$

and $$\mu_r''(f) \approx \epsilon_r''(f) \rightarrow \infty \qquad (7)$$

For this ideal material, increasing the imaginary parts of the permittivity and permeability decreases the thickness of the absorbing material required to achieve a desired level of performance. For practical absorber design, the above criteria are required over a broad but finite band of frequencies.

Hexcel has produced materials with controlled, frequency dependent dielectric properties using Debye relaxations (U.S. patent application Ser. No. 07/890,757). Magnetic loss which exhibits Debye-like behavior can be obtained in one of two ways, 1) using natural, lossy magnetic materials, such as ferrites or 2) using the skin-effect of permeable, conducting materials (L. D. Landau and E. M. Lifshitz, *Electrodynamics of Continuous Media,* Pergamon Press, Oxford, 1984). The Debye relaxation of the real part of either the permittivity or permeability produces an imaginary part that contributes to power dissipation in the material.

Since both electric and magnetic materials can exhibit controlled Debye-like behavior, it is possible to design a material that has an impedance that is essentially matched to free space over the desired band of frequency and has both magnetic and electric loss mechanisms. The present invention involves the design and fabrication of a composite material that combines synthetic dielectric materials with a lossy magnetic material (either natural or skin-effect). The amount of materials, shaping and material properties are selected by the designer so that the relative permittivity and permeability are substantially the same over the frequency range of interest and the composite material exhibits both electric and magnetic loss mechanisms. The performance of the composite material can be enhanced by grading the properties of the material and/or shaping the material, just as with prior art materials.

Three examples of composite materials which exhibit this behavior are given below. The first uses conducting, permeable spheres, which use the skin-effect for the magnetic loss, embedded in a conducting foam, which gives the electric loss. The second uses spheres that in themselves are lossy and are matched to free space. In this example, the magnetic loss can be either a natural loss, such as a ferrite, or a skin-effect loss as in the first example. The electric properties are determined by controlling conductivity of the spheres. The final example matches the natural Debye response of ferro fluids to a synthetic Debye dielectric.

EXAMPLE NO. 1

For applications where superbroad bandwidth materials is not required, it is possible to obtain a desired level of performance over a finite bandwidth at less weight, by using partially-matched materials. The material uses a dispersion of magnetic metal shells in the presence of a DC conducting medium. The resulting high synthetic permeability and conductivity properties are then graded in a simple two-material stack in order to obtain a −20 dB reflection coefficient over the 2 Ghz to 4 GHz frequency band. The total weight of the composite is calculated to be less than 1.5 lbs/ft 2.

1. Introduction—I.J. Enhanced Diamagnetics

I. S. Jacobs of the General Electric Corporate Research and Development Center has published several articles in the open and classified literature on the properties of magnetic alloy powder composites (I. S. Jacobs, Modeling Magnetic RAM Alloy Powder Composites, *Proceedings of the* 1992 Have Forum LO Symposium, Dayton, Ohio, pp. 125–132, 1992 and I. S. Jacobs et. al., Microwave Properties of Non-Percolating Metal-Insulator Composites, *Materials Research Society Symposium Proceedings,* vol. 195, pp. 169–174, 1990). His two main contributions to the state of the art are the development of an effective cluster model for calculating the artificial dielectric properties of such composites and the similar first principles approach to the calculation (and demonstration) of the artificial magnetic properties. We call this family of material, enhanced diamagnetics, because their principal loss mechanism is the onset of eddy currents on the magnetic metal particles, which eventually (at high frequency) render the materials diamagnetic ($\mu<\mu_0$). We call enhanced diamagnetics specifically using dispersed spherical particles at high volume densities (and thus forming clusters) I.J. Enhanced Diamagnetics.

The frequency dependent complex permeability of such a dispersion of particles is best understood as follows:

Assume that the metal powder consists of isotropic spherical multi-domain particles. In that case, at low frequencies the magnetic properties of the particle can be expressed as an intrinsic permeability (whereas if the particles were single domain polarized dipoles we would have to consider their dipole moments and Rodger M. Walser's work, A Study of Thin Film Magnetodielectrics (TFM), PhD Dissertation, University of Michigan, 1967.) The dispersion of permeable particles in a non-magnetic matrix then works according to the principle of volume denial. The high permeability particles draw the magnetic field lines in, only to have them spread again as they hit the non-permeable material separating one particle from its next downstream neighbor. As a result most of the magnetic energy is stored in the space between the particles and excluded from the volume of space where the particles are. In the magnetic circuit being set up from particle to particle, the non-magnetic matrix spaces act as reluctance obstacles across which the field's magnetomotance drops.

Under this scenario, the artificial permeability of the dispersion resembles the artificial permittivity of dispersions of conductive particles. Both are controlled by the principle of volume denial. However, there is one big difference: For the principle of volume denial to work, the particle's intrinsic properties must be much much greater than those of the surrounding matrix. For artificial dielectrics this is easy since the intrinsic permittivity of a conducting powder can effectively approach infinity (since $\epsilon_r"=\sigma/(\omega\epsilon_0)$), whereas for artificial magnetics the intrinsic permeability of the powder can never be that high. Fortunately, the principle of volume denial does not really make full use of the particle's intrinsic property, it only uses it to concentrate the field lines relative to the inert matrix. The artificial material's final effective property is not the result of a mixing rule between the particle's intrinsic property and that of the matrix, but rather it is entirely due to the final configuration of the field inside the material. The net result is that a dispersion of conductive permeable spheres suspended in air would have a high, purely real, artificial dielectric constant and an almost equal high artificial permeability.

Now, as this ensemble of spheres is illuminated by radio-frequency waves, the high conductivity of the particles guarantees that this dispersion will retain its high, purely real, dielectric constant. But, this will not be the case for the permeability. As the frequency is increased, the magnetic field of the waves induces eddy currents in the particles which will tend to push the magnetic field lines out of them. As the magnetic field lines are pushed out, the effectiveness of the particles in forcing volume denial of the magnetic field diminishes. This drop in effectiveness becomes much more severe as the frequency at which the depth of penetration is comparable to the physical size of the particles is approached. After that frequency, only that portion of the material within one skin depth has any role in pulling field lines in, and this hold continues to be diminished by the ever growing repulsive force of the eddy currents. Eventually, the particle can no longer pull the field lines in, the eddy currents dominate, and the particles actually start repelling the magnetic field lines. Volume denial is completely overthrown and the permeability of the medium starts to drop below that of free space.

Given the above description, the real part of the permeability of this artificial medium is expected to follow a curve of the form shown in FIG. 1. Since this behavior is casual, the imaginary part of the permeability will change correspondingly according to the Kramers-Kronig relations. Using Debye materials as a guideline, it can be expected that the imaginary permeability will reach a peak value near the inflection point of the real permeability curve whose height will be of the order of one half the total drop in permeability.

To obtain desired behavior, the complex permittivity is supposed to match the complex permeability as a function of frequency. However, as we have already pointed out, this dispersion of highly conductive particles will exhibit a low-loss, high permittivity at all RF frequencies. Therefore, it is generally impossible to force the permittivity and permeability profiles to match. The only alternative left is to add a DC conductivity (purely imaginary permittivity) to the artificial dielectric and use it to partially match the imaginary part of the complex permeability. This is the approach proposed here.

In I. S. Jacob's work such an approach was apparently never considered. Part of the reason may be the assumption that the matrix in which the particles are to be dispersed is a plastic of dielectric constant 3.0 or higher. As a result the value of the artificial permittivity of his material is three or more times higher than its artificial permeability. With such a disparity, there is no hope for matching the properties over any significant bandwidth. Furthermore, his model for the artificially enhanced permeability is not based on volume denial. That is, even though he uses his cluster model for the permittivity, he does not use it for the permeability. Instead, he uses the old Clausius-Mosotti model. This results in the artificial enhancement of the permeability being significantly lower than the artificial enhancement of the permittivity, further exacerbating the expected mismatch.

This example goes beyond I. S. Jacobs' work by using the following novel approaches:

1. Disperse the metal powder in a low dielectric foam matrix so that the final artificial permittivity is not multiplied by a high intrinsic dielectric constant.
2. Embed this foam inside a loaded honeycomb to give the material structural integrity and add DC conductivity. While we cannot make the complex permittivity as a function of frequency identical to the complex permeability, we can have both a real and imaginary part to help effect a partial match.
3. Reduce the weight of the composite dramatically by utilizing spherical shells of magnetic metal (e.g. metal-coated glass microballoons) instead of solid spheres.
4. Since the peak magnetic properties of the material will be dropped by substitution of shells for spheres, the absorbing performance of the bulk material is reduced. This is to be compensated for by improving the match of the material to free space through the use of 'grading.' That is, as a minimum, the material will consist of two layers, the upper of which will be less 'loaded' than the lower. The absolute levels of loading, ratios thereof between the two layers, thicknesses, permittivities and conductivities of the layers will all be arranged to obtain the desired absorption level over the desired band of frequencies.

2. Development of the Composite Material Model

Adopting I. S. Jacobs' cluster model, the artificial enhancement of the permittivity of the composite material due to volume denial is given by the equation:

$$\epsilon' = 1 + \frac{3(p + 0.932p^2)}{1 - (p + 0.932p^2)} \epsilon_{matrix} \qquad (8)$$

where p is the volume fraction of the powder.

Since the dipole moment and polarization contributed by the particles is proportional to p, this model can be considered a modified Clausis-Mosotti model. The artificial enhancement of the permeability is given by a similar equation except that we derate the dipole moment contributed by the particles by the fact that they do not have an infinite permeability. The form of the derating factor must be the same as that due to the difference between the dielectric dipole moment of a conducting sphere (permittivity→∞) and the dipole moment of a dielectric sphere of finite permittivity of the same size in the presence of the same field.

Thus by analogy, we define the effective magnetic volume fraction as:

$$p_{\text{eff}} = p\left(\frac{\mu_i - 1}{\mu_i + 2}\right) \qquad (9)$$

where mi is the initial low frequency permeability of the metal, and we obtain:

$$\mu' = 1 + \frac{3(p_{\text{eff}} + 0.932p_{\text{eff}}^2)}{1 - (p_{\text{eff}} + 0.932p_{\text{eff}}^2)} \qquad (10)$$

as the initial (low frequency) artificially enhanced permeability of our composite.

The last characteristic of the material that can be written by inspection is the diamagnetic limit of its permeability. In this limit, the magnetic field must all flow around the particle. The reluctance of the unit cell of the magnetic circuit can be estimated under the assumption that the dispersion is a perfectly periodic cartesian array of spheres (see "Details of Derivation" section below). Therefore in the high frequency limit:

$$\mu_\infty = \frac{0.5}{(0.5 - a) + \left(\frac{1}{\sqrt{\pi b}} \tan^{-1}\left(a\sqrt{\frac{\pi}{b}}\right)\right)} \qquad (11)$$

where $$a = \left(\frac{3}{4\pi} p\right)^{\frac{1}{4}}$$

is the effective radius of the particle and $b = 1 - \pi a^2$.

The model of (11) appears to agree well with I. S. Jacobs' data on the same limit.

Now, as noted in step 3 of the proposed approach, we wish to consider permeable shells of material instead of solid spheres. Such a choice minimizes the weight to induced-dipole moment ratio. We will assume that the effect of substituting a shell for the solid sphere in the cluster model can be taken into account by calculating an effective volume fraction. Again, as in the case of (9), we claim that the derating factor must be proportional to the difference in dipole moment between the two choices. Thus just as the dipole moment of an isolated sphere of radius a is given by $$4\pi a^3 \frac{\mu_i - 1}{\mu_i + 2}, \qquad (12)$$

the dipole moment of a shell of the same external radius is given by:

$$4\pi a^3 \frac{(\mu_i - 1) - \left(\frac{r}{a}\right)^3 (\mu_i - 1)}{(\mu_i + 2) - 2\left(\frac{r}{a}\right)^3 \frac{(\mu_i - 1)^2}{1 + 2\mu_i}} \qquad (13)$$

where $\mu_i$ is the intrinsic relative permeability of the shell material, a is the external radius and r the internal radius.

Assuming that the intrinsic permeability of Nickel above 2 GHz is of the order of 30.0, the effective volume fractions for the permeability are:

$$p_{\text{eff}}^{\text{solid}}(\text{Ni}) \propto 4\pi a^3 (0.906) \qquad (14)$$

$$p_{\text{eff}}^{\text{shell}}(\text{Ni}) \propto 4\pi a^3 \frac{29 - 29(r/a)^3}{32 - 27.574(r/a)^3} \qquad (15)$$

So that, if we chose the shells to contain only ⅛ of their volume in Nickel, $(r/a)^3 = ⅞$ and $$p_{\text{eff}}^{\text{shell}}(\text{Ni}) \propto 4\pi a^3 (0.430) \qquad (16)$$

which is 47% of (14).

That is, by using the shell geometry, we can drop the Nickel weight by 89% and retain 47% of the dipole moment. This is one of the novel aspects of our approach and it is worth reiterating:

In I. S. Jacobs' work, there is little to no advantage in going to materials with higher and higher permeability, since the dipole moment of equation (12) can never exceed $4\pi a^3 (1.0)$. Thus, if iron has a permeability in the GHz range of the order of 100, the solid sphere's dipole moment increases from the 0.906 of equation (14) to 0.97, a net 7% increase. However, with the shell approach, the permeability can always be traded off against the shell thickness to obtain an optimal solution. So, since Iron and Nickel have the same approximate density, if we used shells of ⅛ the volume of Iron, the shells would contribute the same weight to the composite as the Nickel, but, their dipole moment would be increased to $4\pi a^3 (0.718)$, a 67% increase over (16). Similarly, if the dipole moment attained in (16) is acceptable for our purposes, then going to a more permeable metal can be used to obtain a lighter composite. Again, if Iron's permeability is 100, the dipole moment of (16) can be obtained with only 3.4% of metal weight as opposed to the 11% metal weight that gave (16).

Equations (8) through (16) are sufficient to design the desired composite.

3. Design of a Finite Bandwidth Partially Matched Material

As stated in section 2, the complex permeability of our composite material will come about by the onset of eddy currents in the metal particles of finite thickness. The functional form of the variation with frequency can be estimated by studying the properties of laminates. As suggested in FIG. 1, the behavior resembles that of a Debye relaxation, with the relaxation frequency occuring when the laminate thickness is approximately 2.2 times the skin depth. This is formally true below the relaxation frequency. Above the relaxation frequency both the real and imaginary parts of the particle's intrinsic permeability appear to go to zero as $1/\sqrt{f}$ (because the eddy currents are expelling the field lines) and the real permeability of the composite approaches the diamagnetic limit $\mu_\infty$.

In our case of permeable spherical shells, the thickness of the shell plays the role of the laminate thickness and thus, the permeability properties of the composite can be tuned by the absolute thickness of the metal shell. For a finite bandwidth material, all the work will be done at or below the relaxation frequency, thus, a Debye model is sufficient to represent the magnetic properties. To first order, then, the parameters of the synthetic magnetodielectric material resulting from dispersing a volume fraction p of permeable spherical shells are obtained as follows:

Let $p_{eff}$ be given by equation (8) as $0.430p$, $\mu_\infty(p)$ is given by (11) and $\mu_{initial}$ is given by (10). The Debye step is then $\mu_{initial} - \mu_\infty$, which controls the peak of the imaginary permeability. The dielectric constant is given by (8). We assume that a matrix foam of intrinsic dielectric constant of the order of 1.1 is available into which the particles will be dispersed. We also assume that if needed, this dielectric constant can be increased above the increase due to the particles by adding microscopic metal fibers to the foam (as in classic artificial dielectric lens foams.) Finally, for the sake of simplicity, we assume that over the band of interest, the loaded honeycomb that will provide the required conductivity, can be modelled as a DC conductivity with a real permittivity equal to or lower than that of the combined composite. (This is realistic since around 2 GHz the highest typical value of loaded honeycomb's dielectric constant is of the order of 2.0).

A sampling of the values obtainable with different volume fractions are given below

| Volume fraction $\rho$ | $\mu_\chi$ | $\mu_{initial}$ | $\mu_{step}$ | $\epsilon_r$ in 1.1 foam | effective metal density lbs/ft³ |
|---|---|---|---|---|---|
| 10% | 0.89 | 1.14 | 0.25 | 1.51 | 5.51 |
| 13% | 0.85 | 1.18 | 0.33 | 1.66 | 7.16 |
| 25% | 0.71 | 1.39 | 0.69 | 2.57 | 13.8 |
| 34% | 0.59 | 1.59 | 0.99 | 3.78 | 18.7 |
| 37% | 0.56 | 1.66 | 1.11 | 4.36 | 20.4 |
| 40% | 0.52 | 1.74 | 1.22 | 5.12 | 22.1 |
| 42% | 0.51 | 1.79 | 1.29 | 5.74 | 23.2 |

We now proceed to consider a composite material consisting of two layers of synthetic magnetodielectric. To obtain the first null near 2 GHz will require the lower layer to be loaded to a volume fraction of the order of 40%. To grade this, the upper layer will need some permeability. We assume that the upper layer will be loaded to about 10% and start an iteration procedure. The parameters varied during the iteration are:

1. The volume fraction of the magnetic loading in each layer.
2. The DC conductivity to either layer.
3. The amount of increase in the real part of the permittivity of the layer above that dictated by the particle loading.

The goal is to obtain a reflection coeffcient that is less than or equal to −20 dB over the 2 GHz to 4 GHz band. After some iteration it is found that the bottom layer must be loaded up to about 35% volume fraction to have enough loss and to depress the first null's frequency low enough to cover the low end of the band. A certain amount of DC conductivity must be added to this layer, proportional to its magnetic loss; typically in the 0.5 to 0.7 mho/meter range. It is found that the upper layer requires no DC conductivity and can have a particle loading as low as 13%. Its permittivity, however, must be kicked up above the enhancement given by the powder by about 35%, to serve as a proper match for the high permittivity of the bottom layer. The conductivity requirements of both layers can be accomodated with a single T-graded honeycomb.

Two possible configurations, exhibiting the desired behavior, although not fully optimized, are given below. For both designs, fibers are added to layer 1 (the outer layer) to raise the DC permitivity to 2.2. The lower layer can be either 34% or 37% loaded, with its conductivity adjusted accordingly. The calculations were done by modeling the magnetic behavior as two Debye relaxations. The first has a Debye step ⅚ of the total given in Table I, at the desired relaxation frequency, and the second has the remaining ⅙ of the Debye step at a relaxation frequency that is 25 times higher. Under this convention, the magnetic properties of the material are written as:

$$\mu = \mu_\infty + \left(\frac{5}{6}\right)\mu_{step} @ f_{relax} + \left(\frac{1}{6}\right)\mu_{step} @ 25 f_{relax} \quad (17)$$

Design #1

Layer 1  $\rho_v = 13\%$  $\sigma_{DC} = 0.0$  $\epsilon_{DC} = 2.2$
         $\mu = 0.852 + 0.278@5\text{ GHz} + 0.056@25\text{ GHz}$
Layer 2  $\rho_v = 34\%$  $\sigma_{DC} = 0.6$  $\epsilon_{DC} = 3.78$
         $\mu = 0.59 + 0.825@5\text{ GHz} + 0.165@25\text{ GHz}$ Design #2

Figure 2:
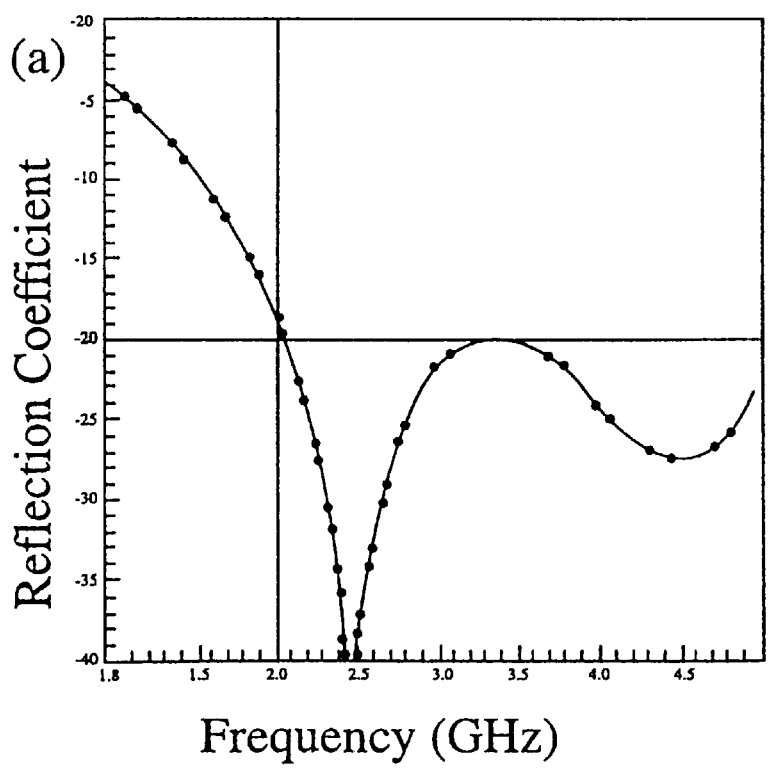
FIGS. 2 and 3 plot reflection coefficient versus frequency for two different designs with radiation at near normal incidence.
Figure 3:
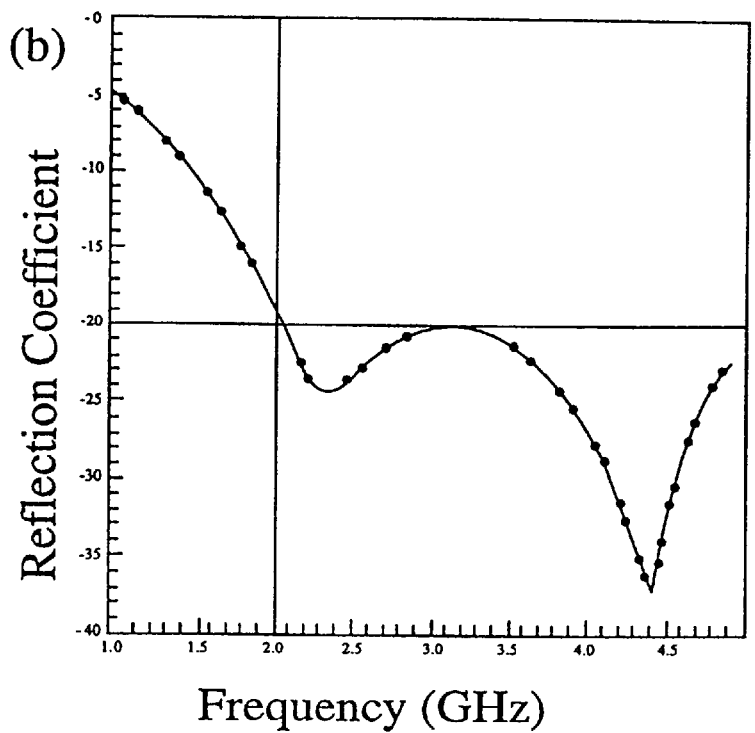

Layer 1  $\rho_v = 13\%$  $\sigma_{DC} = 0.0$  $\epsilon_{DC} = 2.2$
         $\mu = 0.852 + 0.278@5\text{ GHz} + 0.056@25\text{ GHz}$
Layer 2  $\rho_v = 37\%$  $\sigma_{DC} = 0.65$  $\epsilon_{DC} = 4.36$
         $\mu = 0.56 + 0.925@5\text{ GHz} + 0.185@25\text{ GHz}$ The Reflection Coefficient of these two designs near normal incidence are given in FIG. 2 and FIG. 3.

4. Conclusion

It has been shown that a graded synthetic magnetodielectric material can be constructed to meet a −20 dB specification over the 2 GHz to 4 GHz band. The construction is novel in that it uses I.J.Enhanced Diamagnetics in the form of spherical shells for light weight, a foam matrix for minimized dielectric constant and a honeycomb structure to provide the loss for the lower layer and structural strength for the whole composite. The magnetic metal shells are assumed to be constructed by coating glass microballoons with a thin layer of the desired metal at the prescribed thickness. Various companies, such as MER in Tucson, Ariz., have this capability.

The weight of the composite material can be computed by combining the weight of the shells with the weight of the honeycomb/foam combination. The shells weight is computed from weight = $p_v$ × (ratio of shell volume/sphere volume) ×

(relative density of metal to water) ×

(mass of water in lbs/ft³)

which for nickel becomes weight=$p_u$×(ratio of shell volume/sphere volume)×8×64 lbs/ft³.

We also assume that the honeycomb/foam combination has a natural worst case density of 4 lb/ft³. Under these assumptions, the heaviest of the two examples cited has a weight per square foot of area covered given by:

0.5"×(1 ft/12")×21.05 lb/ft³

+0.4"×(1 ft/12")×7.39 lb/ft³

+0.9"×(1 ft/12")×4 lb/ft³=1.423 lb/ft².

As mentioned earlier, the present design approach takes full advantage of the permeability of the magnetic metal; thus dramatic savings in weight can still be obtained by going to a more permeable metallic coating for the glass microballoons.

Details of Derivations
1. The Diamagnetic Limit
   1. Assume the field lines in the unit cell must flow around the sphere.
   2. Assume that the cubical unit cell can be approximated by a cylindrical unit cell of equal height and equal cross sectional area.

Figure 4:
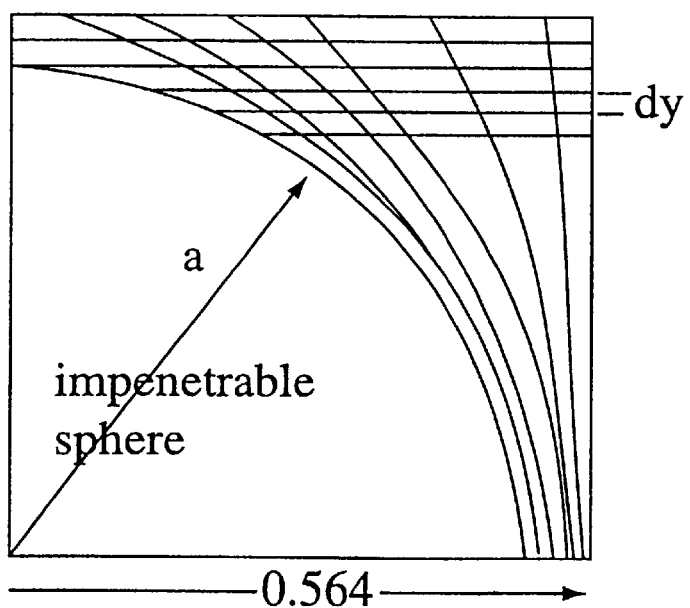
FIG. 4 illustates a reluctance flow field for a sphere within a unit cell.

Then the problem is circularly symmetric and reduces to determining the reluctance of the flow field in FIG. 4 as compared to the reluctance of the empty unit cell. As suggested in the figure, since reluctance is defined as $(1/\mu)$*length/area, the total reluctance must be approximately equal to the sum of the elementary reluctances of each annular slice of height dy.

$$R_{diam} = \frac{1}{\mu_0}\left\{\frac{1-a}{A_{cyl}} + \int_0^a \frac{dy}{A_{cyl} - \pi a^2 + \pi y^2}\right\} \quad (18)$$

where $A_{cyl}$ is the area of the cylindrical unit cell $\pi(0.5642)^2$.

The reluctance of the unit cell is, by comparison:

$$R_{cell} = \frac{1}{\mu_0}\left\{\frac{1}{\pi(0.5642)^2}\right\} \quad (19)$$

$$\mu_\infty = \frac{0.5}{(0.5-a) + \left(\frac{1}{\sqrt{\pi b}}\tan^{-1}\left(a\sqrt{\frac{\pi}{b}}\right)\right)} \quad (20)$$

2. The Dipole Moment of a Spherical Shell

Figure 5:
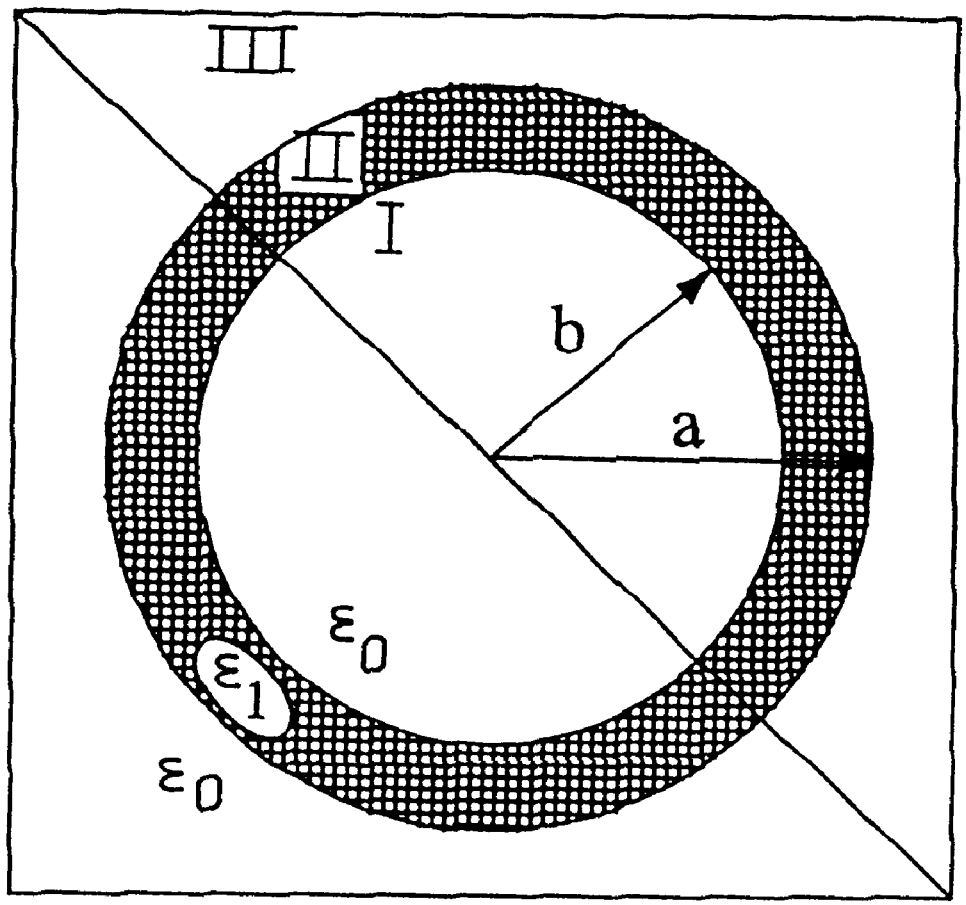
FIG. 5 illustrates placement of a dielectric shell in a uniform electric field and separating the field into three regions.

Following Jefimenko (Oleg D. Jifimenko, Electricity and Magnetism, Appleton-Century-Crofts, 1966), place a dielectric shell in a uniform electric field and expand the potential field in the three regions shown in FIG. 5 into spherical harmonics. Then:

In Region III we have:

$$\emptyset = (A_{31}r + B_{31}r^{-2})\cos\theta \quad (21)$$

$$\frac{\epsilon \partial \phi}{\partial r} = (\epsilon_0 A_{31} - 2\epsilon_0 B_{31}r^{-3})\cos\theta \quad (22)$$

In Region II we have:

$$o = (A_{21}r + B_{21}r^{-2})\cos\theta \quad (23)$$

$$\frac{\epsilon \partial o}{\partial r} = (\epsilon_1 A_{21} - 2\epsilon_1 B_{21}r^{-3})\cos\theta \quad (24)$$

In Region I we have:

$$\emptyset = A_{11}r\cos\theta \quad (25)$$

$$\frac{\epsilon \partial \phi}{\partial r} = \epsilon_0 A_{11}\cos\theta \quad (26)$$

At infinity the potential field must reduce to the uniform applied field $-Er\cos\theta$. Therefore, $A_{31}=-E$. At r=a we set the potentials and the normal components of D of Regions II and III equal to each other. At r=b we set the potentials and the normal components of D of Regions I and II equal to each other. The result of the latter is that:

$$B_{21} = A_{21}\left(\frac{\epsilon_1 - 1}{1 + 2\epsilon_1}\right)b^3 \quad (27)$$

which then substitutes into the former to yield:

$$A_{21} = \frac{-2\frac{B_{31}}{a^3} - E}{\epsilon_1 - 2\epsilon_1 \frac{b^3}{a^3}\left(\frac{\epsilon_1 - 1}{1 + 2\epsilon_1}\right)} \quad \text{and} \quad (28)$$

$$A_{21} = \frac{\frac{B_{31}}{a^3} - E}{1 + \frac{b^3}{a^3}\left(\frac{\epsilon_1 - 1}{1 + 2\epsilon_1}\right)} \quad (29)$$

Setting these equal to each other we obtain:

$$\frac{B_{31}}{a^3} = E\left\{\frac{(\epsilon_1 - 1) - \frac{b^3}{a^3}(\epsilon_1 - 1)}{(\epsilon_1 + 2) - \frac{b^3}{a^3}\left(\frac{\epsilon_1 - 1}{1 + 2\epsilon_1}\right)(2\epsilon_1 - 2)}\right\} \quad (30)$$

In the limit b=0, we recover the solution for a solid sphere:

$$\frac{B_{31}}{a^3} = E\left\{\frac{(\epsilon_1 - 1)}{(\epsilon_1 + 2)}\right\} \quad (31)$$

And so (12) and (13) of the text follow.

EXAMPLE NO. 2

It is possible to manufacture a sphere such that the electric and magnetic polarizabilities can be made equal. An array of such spheres will exhibit, for the volume they occupy, the same effective permittivity and permeability. The situation allows the manufacture of an electromagnetically lossy material where its loss can be controlled by the concentration of spheres it contains. In addition, the relaxation frequency of the electric and magnetic polarizabilities are designed to be the same by choosing the sphere radius and conductivity. The resulting material will be intrinsically matched to free space. Two sphere design approaches will be presented to demonstrate this concept's versatility.

The electric polarizability of a sphere is given by $$\alpha''_e = 4\pi a^3 \left( \frac{\epsilon''_r - 1}{\epsilon''_r + 2} \right) \quad (32)$$

where a is the sphere radius and $\epsilon_r''$ is the complex permittivity of the material.

When $\epsilon_r''$ is equal to $$\epsilon''_r = \epsilon'_r - j \frac{\sigma}{\omega \epsilon_0} \quad (33)$$

where $\sigma$ is the material conductivity, $\omega$ is the radian frequency and $\epsilon_0$ is the permittivity of free space, and as long as $\epsilon_r' < \sigma/(\omega \epsilon_0)$, then the electric polarizability is clearly a Debye response.

Figure 6:
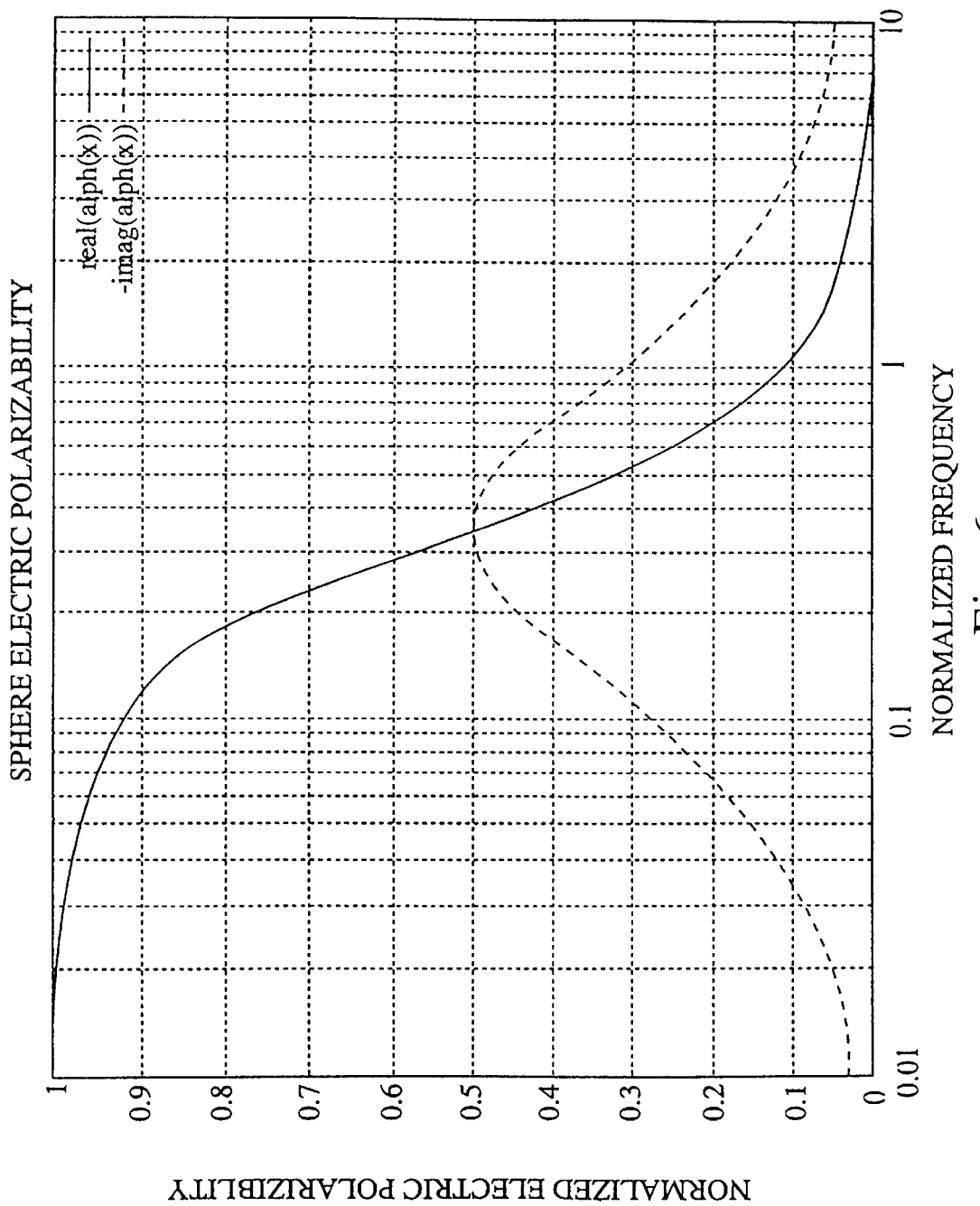
FIG. 6 plots the real and imaginary parts of normalized electric polarizability versus frequency in GHz for a conducting sphere.

FIG. 6 shows the electric polarizability of a conducting sphere normalized to $4\pi a^3$, i.e. $\overline{\alpha}_e'' = \alpha_e''/(4\pi a^3)$ with $\epsilon_r'' = 1 - j1/\omega$.

The magnetic polarizability is the sum of two contributions. These are the permeability polarizability and the polarizability due to eddy currents. The equation for the magnetic polarizability is $$\alpha''_m = 4\pi a^3 \left( \frac{\mu_r - 1}{\mu_r + 2} - \frac{1}{2} \frac{3\mu_r}{\mu_r + 2} \left[ 1 + 3 \frac{ak\cot(ak) - 1}{a^2 k^2} \right] \right) \quad (34)$$

where $\mu_r$ is the relative permeability of the material and k is the complex phase constant in the material and is related to the skin depth, $\delta$, by $$k = \frac{1 - j}{\delta} \quad (35)$$

$$\delta = \sqrt{\frac{2}{\omega \mu_0 \mu_r \sigma}} \quad (36)$$

and $\mu_0$ is the permeability of free space.

Figure 7:
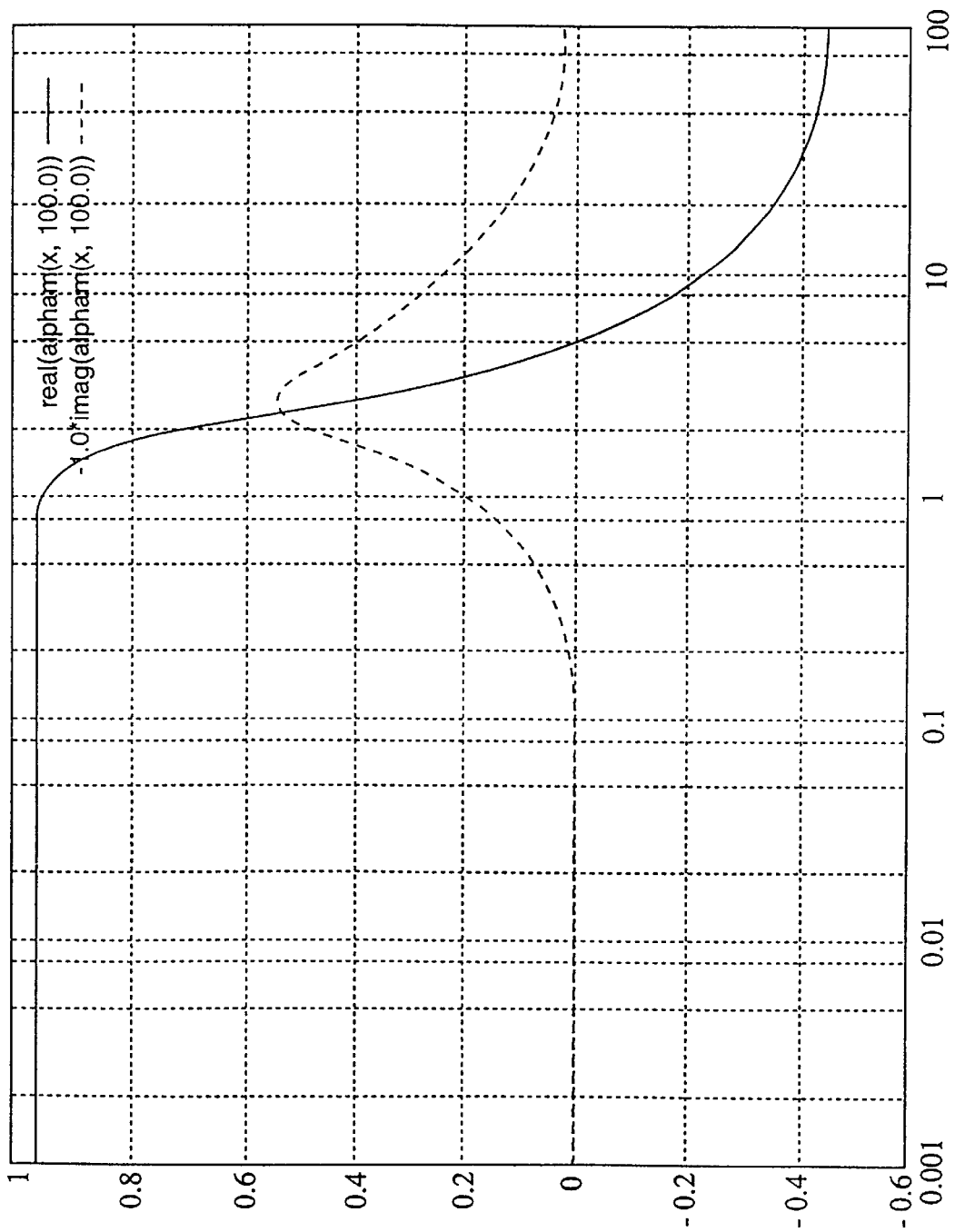
FIG. 7 plots the real and imaginary parts of magnetic polarizability versus frequency in GHz for the conducting sphere of FIG. 6.
Figure 8:
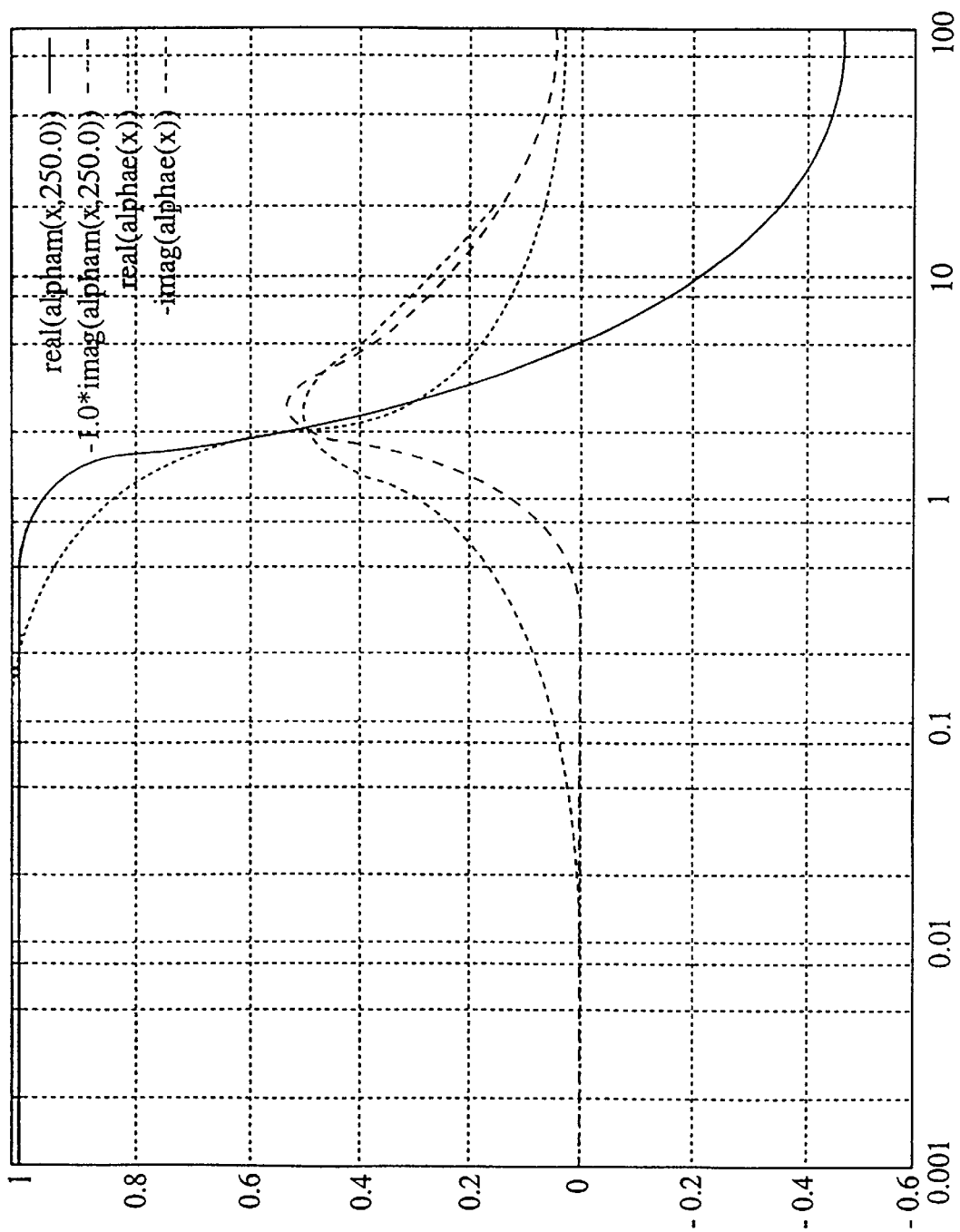
FIG. 8 illustrates the electric and magnetic polarizabilities having the same relaxation frequency for a conducting, permeable sphere.

The magnetic polarizability exhibits a Debye-like response versus frequency. The plot in FIG. 7 shows the complex response of the magnetic polarizability. Clearly, the polarizabilities can have the same relaxation frequency as shown in FIG. 8 with $\alpha_m$ going negative due to diamagnetism.

The effective permittivity of an ensemble of spheres can be calculated using the Clausius-Mosotti equation $$\epsilon''_{eff} = \frac{1 + 2f_f \overline{\alpha}''_e}{1 - f_f \overline{\alpha}''_e} \quad (37)$$

where $f_f$ is the filling fraction and is equal to $4\pi a^3/c^3$ and $c^3$ is a cartesian volume occupied by the a single sphere.

Clearly $\epsilon_{eff}''$ is Debye like due to $\overline{\alpha}_e''$ and the relaxation frequency $\omega_e$ is of the order $\sigma/[(\epsilon_r+2)\epsilon_0]$.

Likewise, the effective permeability is given by $$\mu''_{eff} = \frac{1 + 2f_f \overline{\alpha}''_m}{1 - f_f \overline{\alpha}''_m} \quad (38)$$

and $\mu_{eff}''$ is clearly Debye and the relaxation frequency $\omega_m$ is of the order $$\omega_m = \frac{11.62}{\mu_0 \mu_r \sigma a^2} \quad (39)$$

Manipulations of the appropriate variables in (32) and (34) will enable one to select the performance of an absorber made of spheres with a conductivity $\sigma$ and a permeability $\mu_r$.

Figure 9:
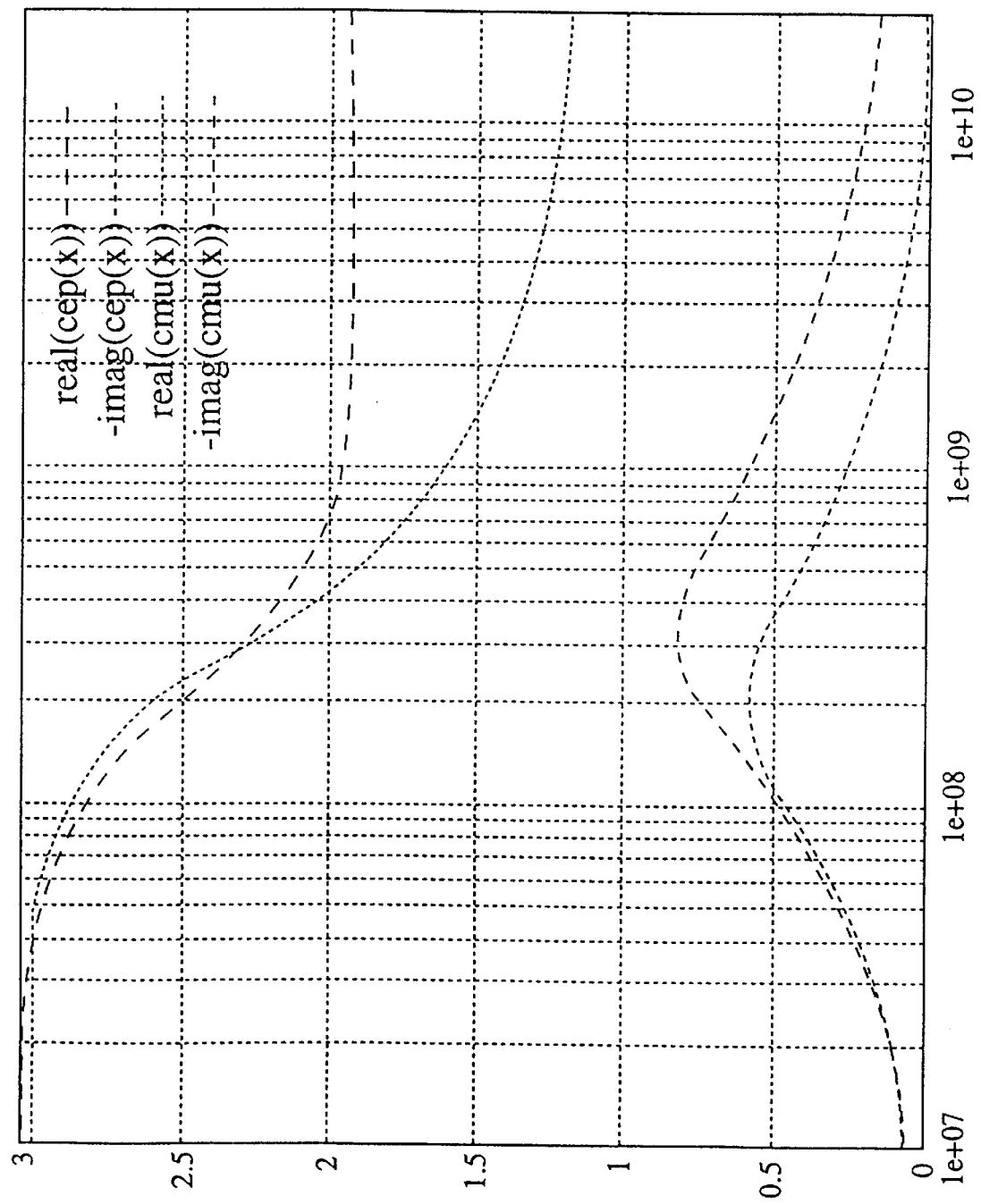
FIG. 9 illustrates complex permeability (CMU) and complex permittivity (CEP) response for a sphere.

FIG. 9 shows the complex permeability (CMU) and complex permittivity (CEP) response of a sphere with a=1 cm $\epsilon_r$=300

$\sigma$=0.1 mho/meter $\epsilon_r$=10

$f_f$=0.4

Figure 10:
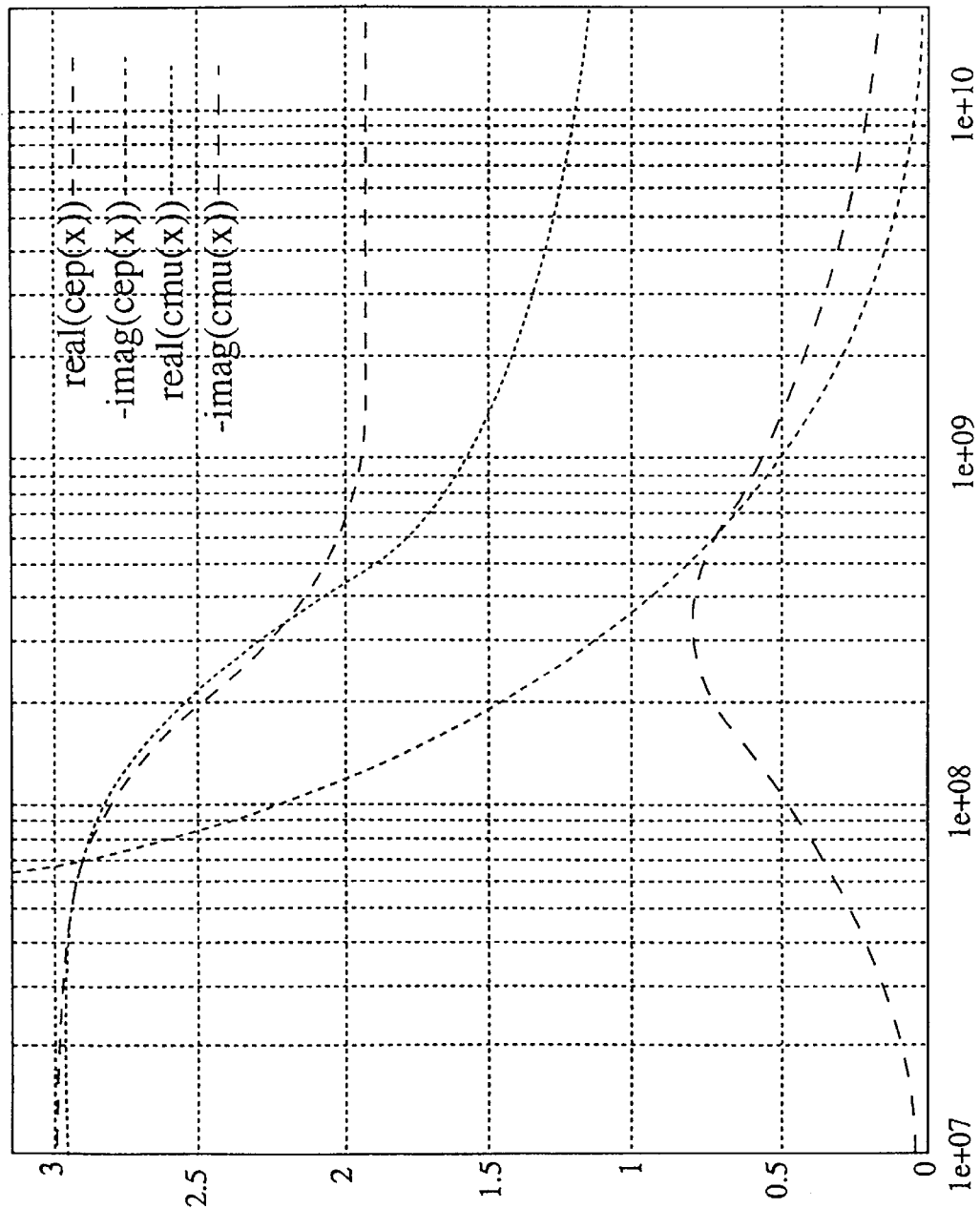
FIG. 10 illustrates the effects of introducing a certain conductive material dispersed in a binding matrix.
Figure 11:
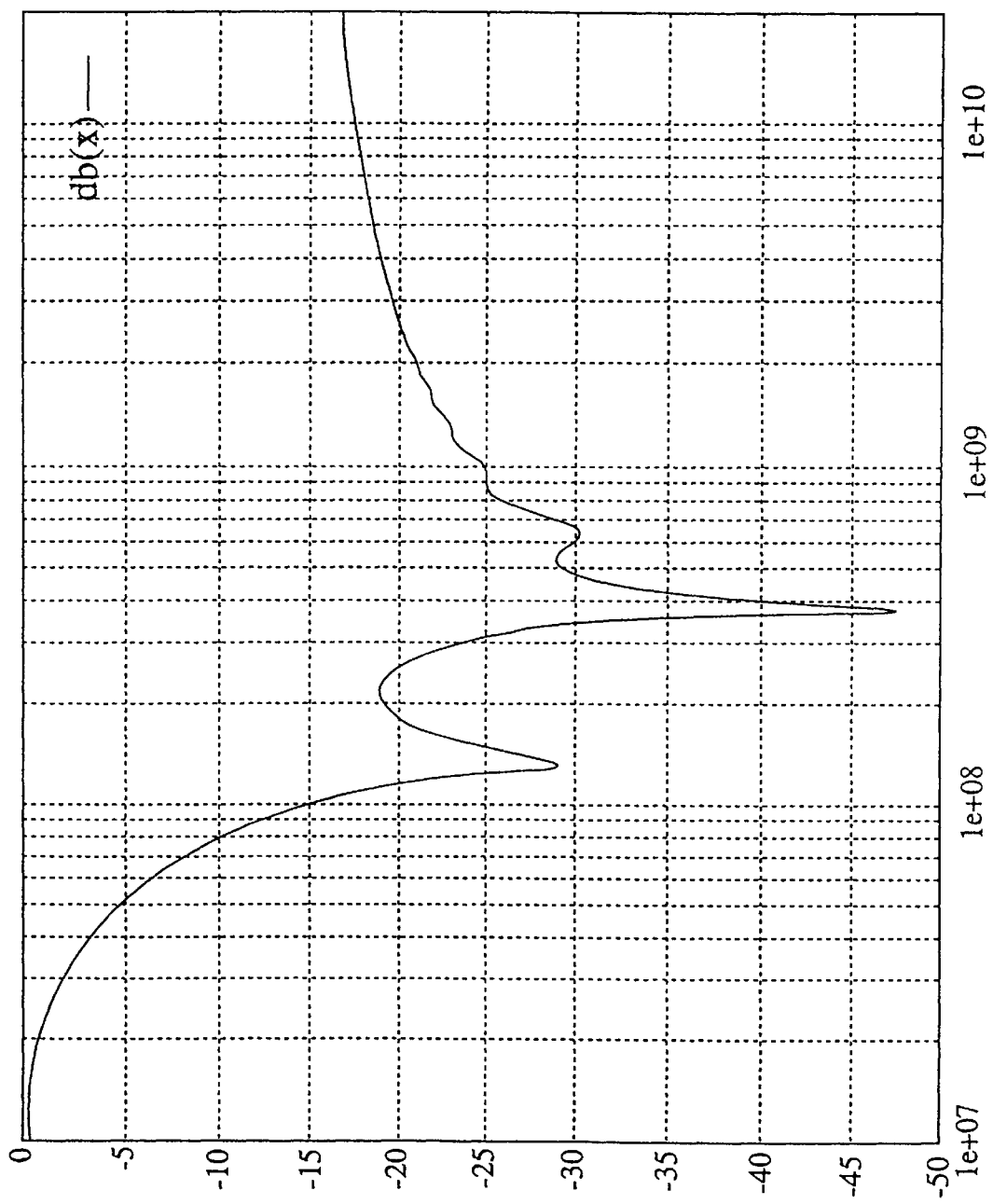
FIG. 11 illustrates the electrical loss of the absorber of FIG. 10 that is 12 inches thick.

To enhance the electrical performance of this absorber, a DC conductivity, has been added to the binding matrix of which the spheres are suspended in. To account for this multiply (37) by $1-j\sigma_{DC}/(\omega\epsilon_0)$. With a conductive material of $\sigma_{DC}$=0.005 mhos/meter dispersed in the binding matrix, FIG. 9 becomes FIG. 10. The electrical loss of this absorber is shown in FIG. 11.

Figure 12:
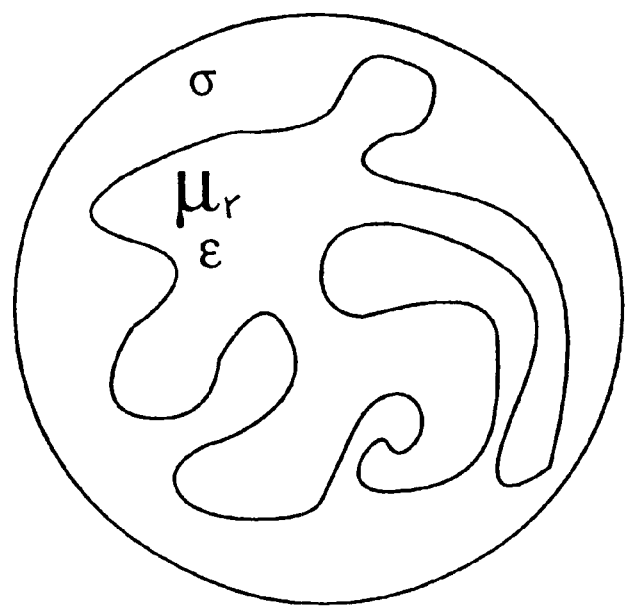
FIG. 12 is a simplified view of an example of a composite sphere of permeable material and conducting material.

This absorber is 30 cm thick. FIG. 12 shows an example of such a composite sphere.

Figure 13:
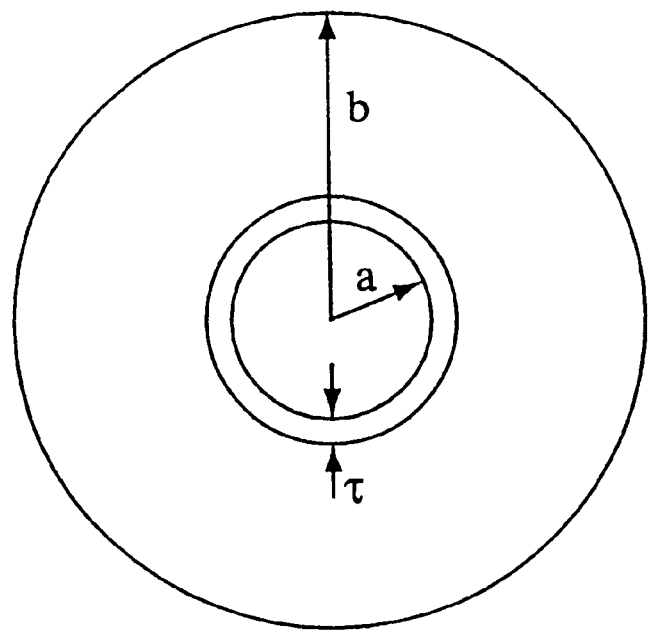
FIG. 13 illustrates a sphere having a glass core encased by a permeable metal shell and surrounded by a layer of low conductivity material.

In the preceding design, the permeable material used was a ferrite with no conductivity in the operating frequency band width of interest. A second design for this example uses a glass sphere core of radius a encased by a permeable metal shell of thickness t surrounded by a layer of low conductivity material of thickness b−(a+t). See FIG. 13.

This sphere has an electric polarizability given by (32) and a magnetic polarizability given approximately by (34). Both terms in (34) are de-rated due to it being a shell and not a solid sphere. Refer to I. S. Jacobs paper, cited above, on conducting spheres. However, the limit values of both terms are the same as before. That is $\alpha_m^{DC}$ is on the order of $4\pi a^3$ and $\alpha_m^\infty$ is on the order of $-2\pi a^3$.

Figure 14:
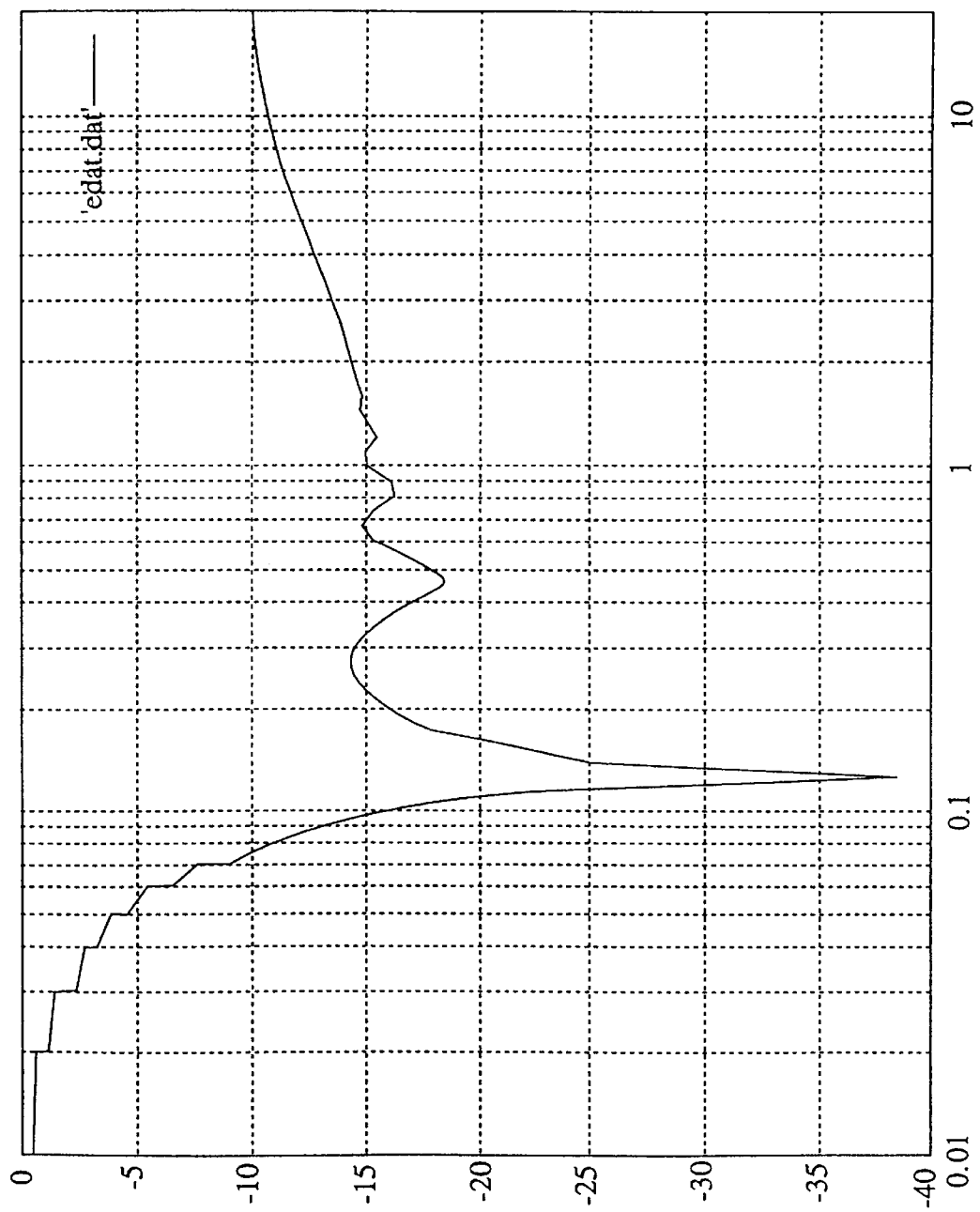
FIG. 14 illustrates the performance (dB loss versus frequency) for a 12 inch thick slab of material composed of spheres of FIG. 13.

The only significant difference between the two expressions is that for a solid sphere, the relaxation frequency is proportional to $1/(\epsilon_r\epsilon_0\sigma a^2)$, where for the shell, $\omega_m$ is proportional to $1/(\epsilon_r\epsilon_0\sigma t^2)$. Therewith lies the benefit of this design. The relaxation frequency control is decoupled from the radius of the sphere. By taking into account the appropriate derating factors, and limits thereof, a plot of the performance for twelve inch thick slab is shown in FIG. 14.

The following are some additional variations of the second example. Based on the first two designs of the second example, an individual skilled in the art can design the following variations. For example FIG. 15 shows a sphere with a ferrite center of constant permeability surrounded by a shell of non-magnetic metal. Eddy currents in the shell control the polarizabilities. FIG. 16 shows a sphere with a 'jack' made of ferrite encased by a conductive material. The advantage of this design is that $\mu_{DC}$ is maximized due to ferrite shape and minimizes the contribution of $\epsilon$ from the ferrite. FIG. 17 is similar to FIG. 16; however, the natural relaxation polarizability of the ferrite is used and the electric relaxation (polarizability) is designed to coincide with the naturally occurring magnetic counterpart.

EXAMPLE NO. 3

Ferro fluids are single domain magnetic particles suspended in a binding matrix. The shape of the particles are usually prolate spheroid and the binding matrix can be either a liquid or a solid. Particle concentrations should be low enough so interparticle interactions of their magnetic fields is not significant. A surfactant coating on the particles can further reduce nearest neighbor interactions.

Figure 18:
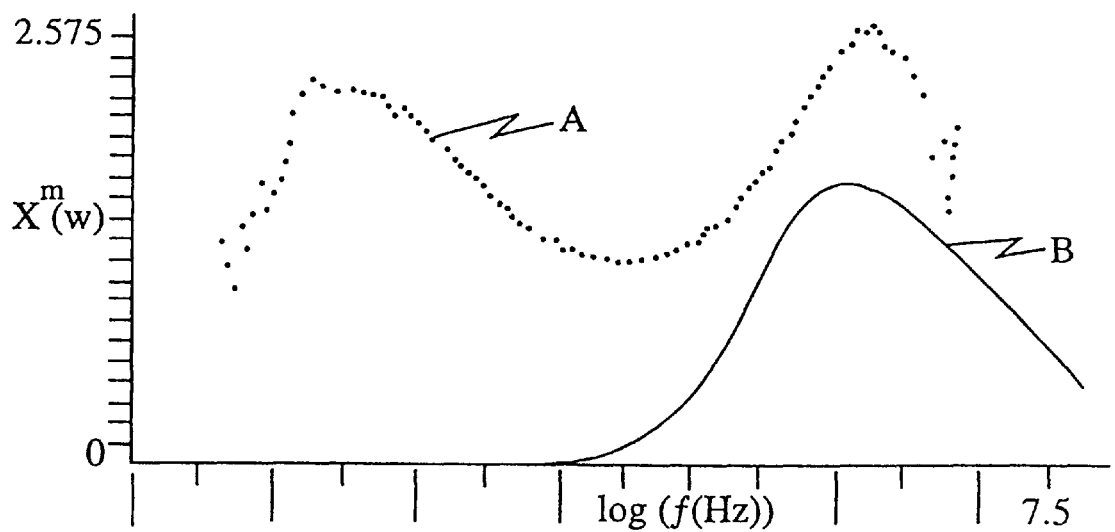
FIG. 18 plots the imaginary magnetic susceptibility versus frequency for a water-based ferrofluid and for a solid-matrix ferrofluid.

Under these conditions, the particles exhibit two magnetic Debye behaviors when they are illuminated by an electromagnetic field, Brownian motion and Neel relaxation. The Brownian motion response is the physical rotation of the particles in a liquid matrix due to the torque induced on the particle by the external electromagnetic field. The Neel relaxation occurs at a frequency that is several orders of magnitude higher that which includes the Brownian motion. The Neel relaxation due to the fixed magnetization vector of the particle trying to follow with an incident electromagnetic field. At these high frequencies the inertia of the particle is so great that it remains fixed in this position as the magnetization vector of the particle responds to the external electromagnetic field. Thus it is possible a Neel relaxation by suspending the particles in a solid binding matrix. The Brownian and Neel Debye responses of ferro fluids made of magnetic particles have been measured. An example of which is shown in FIG. 18 shows the measurements.

Loaded honeycomb which exhibits a desired electric Debye response can be made in accordance with the teachings of U.S. Pat. No. 5,385,623 and can be obtained from Hexcel Corporation of Pleasanton, Calif. as CeCore™ Ferro fluids in liquid or solid form have also been manufactured to exhibit a desired magnetic Debye response. Therefore, it is possible to build a composite material such that the electric permittivity and magnetic permeability frequency responses are made to be equal over a desired frequency band. This composite consists of an electrically tuned Debye honeycomb filled with a liquid or solid ferro fluid with a magnetically tuned Debye response that will match the impedance of free space over that band.

Modifications and variations can be made to the disclosed embodiments without departing from the subject of the invention as defined in the following claims.

Accordingly, what is claimed is:

1. A composite electromagnetic absorption material:
   a) a surface for supporting layers of a dielectric matrix;
   b) a dielectric matrix comprising upper and lower layers of mixed magnetic metal coated microspheres having a magnetic loss, the dimensions for the magnetic metal coated microspheres in 3-dimensional arrangement for the metal coated microspheres being selected so as to provide a desired magnetic permeability within a chosen frequency band;
   c) said lower layer of magnetic metal coated microspheres applied to said supporting surface; and
   d) said upper layer of magnetic metal coated microspheres applied to said lower layer, wherein said upper layer has a density of the magnetic metal coated microspheres less than the density of the metal coated microspheres in the dielectric matrix of the lower layer.

2. The composite material according to claim 1 wherein the mixed magnetic metal coated microspheres includes at least one of the following: nickel-coated microspheres, non-magnetic metal-coated ferrite spheres, and liquid ferrofluids made of magnetic particles.

3. The composite material according to claim 1 wherein the composite material includes nickel-coated microspheres as the magnetic metal-coated microspheres.

4. The composite material according to claim 1 wherein said frequency band is from 10 MHz to 10 GHz.

* * * * *